(12) United States Patent
Chang et al.

(10) Patent No.: US 9,392,683 B2
(45) Date of Patent: Jul. 12, 2016

(54) MULTI-LAYER PRINTED CIRCUIT BOARDS HAVING PROPERTIES SUITABLE FOR LAYER REDUCTION DESIGN

(71) Applicant: Elite Material Co., Ltd., Taoyuan County (TW)

(72) Inventors: Ming-Chuan Chang, Taoyuan County (TW); Li-Chih Yu, Taoyuan County (TW); Yu-Te Lin, Taoyuan County (TW)

(73) Assignee: ELITE MATERIAL CO., LTD., Taoyuan County (TW)

( * ) Notice: Subject to any disclaimer, the term of this patent is extended or adjusted under 35 U.S.C. 154(b) by 0 days.

(21) Appl. No.: 14/554,923

(22) Filed: Nov. 26, 2014

(65) Prior Publication Data

US 2016/0120018 A1  Apr. 28, 2016

(30) Foreign Application Priority Data

Oct. 23, 2014 (TW) ............................. 103136553 A

(51) Int. Cl.
   *H05K 1/02* (2006.01)
   *H01P 3/08* (2006.01)
   *H05K 1/03* (2006.01)

(52) U.S. Cl.
   CPC ................ *H05K 1/024* (2013.01); *H01P 3/082* (2013.01); *H05K 1/025* (2013.01); *H05K 1/0242* (2013.01); *H05K 1/0245* (2013.01); *H05K 1/0298* (2013.01); *H05K 1/0353* (2013.01)

(58) Field of Classification Search
   CPC ......... H01P 3/082; H01P 3/088; H05K 1/024; H05K 1/0242; H05K 1/0245
   USPC ................................. 333/1, 238, 4, 5
   See application file for complete search history.

(56) References Cited

U.S. PATENT DOCUMENTS

| | | | |
|---|---|---|---|
| 6,103,977 A | 8/2000 | Namgung | |
| 6,384,340 B1 | 5/2002 | Cheng | |
| 6,437,991 B1 | 8/2002 | Rog et al. | |
| 6,614,325 B1 | 9/2003 | Kocin | |
| 7,196,274 B2* | 3/2007 | Cooper et al. | H01O 3/088 174/255 |
| 2002/0050870 A1* | 5/2002 | Koga | H01P 3/088 333/1 |
| 2007/0222052 A1* | 9/2007 | Kabumoto | H01L 23/50 257/679 |

* cited by examiner

*Primary Examiner* — Benny Lee
(74) *Attorney, Agent, or Firm* — Muncy, Geissler, Olds & Lowe, P.C.

(57) ABSTRACT

A multi-layer printed circuit board comprises: at least two insulation layers, respectively having glass fiber cloth and cured resin covering thereon, the insulation layers being stacked on each other; an internal trace layer formed between two neighboring insulation layers; and an external trace layer formed on an outer surface of the outermost insulation layer; wherein the insulation layers have a dielectric constant of 3.4 or less, and the internal and external trace layers have a trace width between 40 and 75 micrometers, such that the multi-layer printed circuit board has a characteristic impedance between 45 and 55Ω in single-ended signaling and between 90 and 110Ω in differential signaling.

9 Claims, 2 Drawing Sheets

MULTI-LAYER PRINTED CIRCUIT BOARDS HAVING PROPERTIES SUITABLE FOR LAYER REDUCTION DESIGN

CROSS-REFERENCE TO RELATED APPLICATIONS

This application claims priority of Taiwan Patent Application No. 103136553, filed on Oct. 23, 2014, the entirety of which is incorporated by reference herein.

FIELD OF THE INVENTION

The present invention relates to multi-layer printed circuit boards suitable for layer reduction design and more particularly to multi-layer printed circuit boards with better transmission property and higher process yield rate after multiple laminations where thickness reduction or layer reduction is implemented.

BACKGROUND OF THE INVENTION

Printed circuit boards (PCBs) are critical components for many electronic devices and have evolved from conventional single-layer boards to multi-layer boards which employ multiple circuit layers to enable various circuit designs and applications. Recently, high density interconnection (HDI) technology has been developed, which uses through holes and blind holes to achieve inter-layer circuit connections and signal transmission of multi-layer boards. Inevitably, multi-layer boards tend to have greater thickness. In order to meet the demands of compact, light-weight and conveniently portable electronic products, such as smart phones, PCB makers begin to use thinner glass fiber cloth to make prepregs. Commonly used thin glass fiber cloth includes 1017, 1027, 1037, 106 and 1067 types. Reduction of overall thickness of the PCB products is expected by reducing the thickness of prepregs.

In addition, trace pattern designers have begun studying the ways of using layer reduction to reduce the number of layers of multi-layer boards, in hopes of retaining the signal transmission functionality provided by the original number of layers with reduced overall thickness.

The primary advantages of layer reduction include reducing the overall thickness of PCBs and correspondingly reducing the overall thickness of end products, such as smart phones. In addition, it is well-known that circuit board production involves many different processes, at least including cutting, baking, mechanical drilling (alignment holes), fabrication of inner circuits, layer build-up lamination, laser drilling, exposure and development, fabrication of inner circuits, layer build-up lamination, laser drilling, exposure and development, fabrication of inner circuits and so on, and the formation of each additional circuit layer requires the repetition of several processes that are cost-ineffective, including fabrication of inner circuits, layer build-up lamination, laser drilling, exposure and development, etc. Therefore, the implementation of layer reduction design would greatly save the production costs of multi-layer PCBs.

However, when the thickness of PCBs is reduced, a problem commonly faced by the industry is the higher precision and narrower trace demand, which are prerequisites to meet the specification of characteristic impedance, resulting in substantial decrease of the yield rate of the production process and significant increase of costs. Therefore, there is a need for a PCB design which can maintain excellent signal transmission properties and high yield rate of the production process when the thickness and/or number of layers of PCBs is reduced.

SUMMARY OF THE INVENTION

An object of this invention is to provide a multi-layer printed circuit board comprising: at least two insulation layers, respectively having glass fiber cloth and cured resin covering thereon, the insulation layers being stacked on each other; internal trace layers respectively formed between two neighboring insulation layers; and external trace layers respectively formed on an outer surface of the outermost insulation layers; wherein the insulation layers have a dielectric constant of 3.4 or less, and the internal and external trace layers have a trace width between 40 and 75 micrometers, such that the multi-layer printed circuit board has a characteristic impedance between 45 and 55Ω in single-ended signaling and between 90 and 110Ω in differential signaling.

In one embodiment, the trace width of the internal and external trace layers of the multi-layer printed circuit board is between 40 and 60 micrometers, preferably between 45 and 55 micrometers.

In one embodiment, the glass fiber cloth has a dielectric constant of less than or equal to 6.6 at a frequency of 1 GHz to 10 GHz, preferably less than or equal to 4.9 at a frequency of 1 GHz to 10 GHz.

In one embodiment, the multi-layer printed circuit board has a characteristic impedance of about 50Ω in single-ended signaling and about 100Ω in differential signaling.

The insulation layers with the above-specified dielectric constant may be made by impregnating the glass fiber cloth in a resin composition followed by heating/baking and lamination for curing, wherein the resin composition may comprise, but not limited to, any one of polyphenylene oxide, polyaniline, polyester, polybutadiene, styrene-butadiene copolymer, styrene maleic anhydride, maleimide, cyanate ester, isocyanurate, epoxy resin, polytetrafluoroethylene, benzoxazine, vinyl compound, a modification thereof, and a combination thereof.

By using the glass fiber cloth and insulation layers with specified dielectric constant, the present invention is capable of making multi-layer printed circuit boards having high signal transmission functionality with process conditions of high yield rate.

BRIEF DESCRIPTION OF THE DRAWINGS

A more complete understanding of the subject matter can be derived by referring to the detailed description and claims when considered in conjunction with the following figures, wherein like reference numbers refer to similar elements throughout the figures.

DETAILED DESCRIPTION OF THE INVENTION

Figure 1:
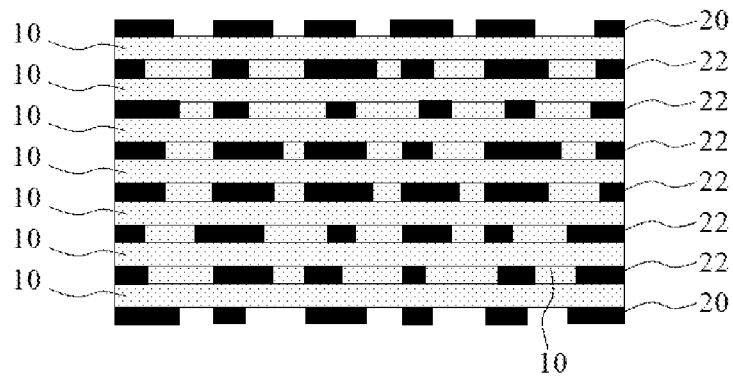
FIG. 1 illustrates a multi-layer printed circuit board of this invention.

Embodiments are illustrated in the accompanying figures to improve understanding of concepts as presented herein.

Skilled artisans appreciate that elements in the figures are illustrated for simplicity and clarity and have not necessarily been drawn to scale. For example, the dimensions of some of the elements in the figures may be exaggerated relative to others to facilitate understanding of the embodiments.

Since various aspects and embodiments are merely exemplary and not limiting, after reading this specification, skilled artisans appreciate that other aspects and embodiments are possible without departing from the scope of the invention. Other features and benefits of any one or more of the embodiments will be apparent from the following detailed description and the claims.

The use of "a" or "an" is employed to describe elements and components described herein. This is done merely for convenience and to give a general sense of the scope of the invention. Accordingly, this description should be read to include one or at least one and the singular also includes the plural unless it is obvious that it is meant otherwise.

As used herein, the terms "comprises," "comprising," "includes," "including," "has," "having" or any other variation thereof are intended to cover a non-exclusive inclusion. For example, a component, structure, article, or apparatus that comprises a list of elements is not necessarily limited to only those elements but may include other elements not expressly listed or inherent to such component, structure, article, or apparatus. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present).

Formula (I) represents the characteristic impedance in single-ended signaling of outer trace (micro-strip) of a printed circuit board:

$$Z_o = \frac{87}{\sqrt{\varepsilon_0 + 1.41}} \ln\left(\frac{5.98H}{8W+T}\right); \quad (I)$$

Formula (II) represents the characteristic impedance in single-ended signaling of inner trace (stripline) of a printed circuit board:

$$Z_o = \frac{60}{\sqrt{\varepsilon_0}} \ln\left(\frac{1.9(2H+T)}{8W+T}\right), \quad (II)$$

, wherein ln represents natural logarithm, $Z_o$ represents characteristic impedance, $\in_o$ represents dielectric constant, W represents trace width, H represents insulation layer height, and T represents conductive layer thickness. From Formulae (I) and (II), it can be inferred that if layer reduction design is employed, the insulation layer height H will decrease, which correspondingly decreases the characteristic impedance $Z_o$. In the meantime, if it is desirable to have the characteristic impedance $Z_o$ unchanged, then the conductive layer thickness T has to be decreased, the trace width W has to be decreased, and/or the dielectric constant $\in_o$ of the insulation layers has to be decreased.

For example, given that the dielectric constant $\in_o$ and the conductive layer thickness T are fixed, in this circumstance, if the insulation layer height H is decreased in order to reduce the overall thickness of the PCB, such as by employing a layer reduction technique, then the trace width W needs to be decreased at the same time to achieve or maintain the characteristic impedance $Z_o$ within a predefined range, such as 50Ω±10% in single-ended signaling and 100Ω±10% in differential signaling, so as to provide the optimal signal transmission (e.g. minimal power loss and maximal power capability). As described herein, single-ended signaling refers to using a single wire to transmit a signal, whereas differential signaling refers to using a differential amplifier to divide a signal into two complementary, opposite signals to be sent on two paired wires, which is advantageous in several ways including noise resistance, applicability to high speed signal transmission, and low voltage.

However, narrow trace width processes involve various factors including exposure, development, etching, clean room conditions, etc., if any of these factors is not well controlled, problems may arise due to, for example, short circuit, over-etching and peel off, unduly narrow trace width and poor impedance associated thereto, unacceptable peel off and low yield rate problems resulted therefrom.

Take the PCBs with conventional copper-clad laminates made of insulation layers of FR-4 material as example. In order to satisfy a characteristic impedance $Z_o$ of about 50Ω, the trace width is generally about 50 to 75 μm. Currently, the yield rate for a 45 to 65 μm trace width process is 90% or higher, and the yield rate for a 40 to 45 μm trace width process is 85% or higher. However, if the thickness of PCBs is decreased or layer reduction design is employed, given that all other conditions/factors remain the same, the trace width has to be reduced to 30 to 40 μm, which corresponds to a process yield rate of only 40% to 55%, such that the wiring yield rate is largely lowered and the overall production costs and defective rate of PCBs are greatly increased.

In view of this, the present invention provides a multi-layer printed circuit board suitable for layer reduction design, wherein glass fiber cloth and insulation layers with low dielectric constant are used; without having to decrease the trace width, a characteristic impedance between 45 and 55Ω in single-ended signaling and between 90 and 110Ω in differential signaling can be attained, as measured by using a time-domain reflectometer (TDR).

FIG. 1 illustrates a multi-layer printed circuit board according to one embodiment of the present invention, wherein the multi-layer printed circuit board 1 is an eight-layer circuit board, mainly comprising: seven insulation layers 10, each having a glass fiber cloth and cured resin covering thereon, the insulation layers 10 being stacked on each other; internal trace layers 22 formed between two neighboring insulation layers 10; and external trace layers 20 formed on an outer surface of the outermost insulation layers 10, wherein the two external trace layers 20 and six internal trace layers 22 constitute eight circuit layers.

In order to achieve desirable characteristic impedance with reduced thickness, the multi-layer printed circuit board 1 may use an ordinary E-glass fabric as the glass fiber cloth, which has a dielectric constant of 6.8 or less in a frequency of 1 GHz to 10 GHz, in conjunction with prepregs impregnated with a low dielectric constant resin composition, such that the insulation layers 10 of the circuit board may have a dielectric constant of 3.4 or less, as measured in accordance with methods specified in Japanese Industrial Standard JIS C2565, thereby achieving a characteristic impedance of 50Ω±10% in single-ended signaling and 100Ω±10% in differential signaling, as measured in accordance with methods specified in IPC-TM-650 2.5.5.7 standard from the Association Connecting Electronics Industries, with a trace width of 40 to 75 Since the multi-layer printed circuit board of this invention can be prepared without having to excessively reduce the trace width, a higher yield rate can be provided, the proportion of non-compliant or defective products can be decreased, and the production costs can be greatly reduced.

To achieve the aforesaid object, in one preferred embodiment, the multi-layer printed circuit board 1 may use a glass fiber cloth which has a dielectric constant of 4.9 or less at a frequency of 1 GHz to 10 GHz, in conjunction with prepregs impregnated with a low dielectric constant resin composition, such that the insulation layers 10 of the circuit board have a dielectric constant of 3.2 or less, as measured in accordance with methods specified in JIS C2565, thereby achieving a characteristic impedance of 50Ω±10% in single-ended signaling and 100Ω±10% in differential signaling, as measured in accordance with methods specified in IPC-TM-650 2.5.5.7 standard from the Association Connecting Electronics Industries, with a trace width of 40 to 60 μm.

Since the multi-layer printed circuit board of this invention can be prepared without having to excessively reduce the trace width, a higher yield rate can be provided, the proportion of non-compliant or defective products can be decreased, and the production costs can be greatly reduced. Glass fiber cloth with dielectric constant (Dk) less than 4.9 used in the multi-layer printed circuit board of this invention is commercially available from Nittobo as NE-glass fabric with Dk of about 4.8 at 1 GHz, or commercially available from Asahi Kasei as L-glass fabric with Dk of about 4.8 at 1 GHz. In general, the dielectric constant of glass fiber cloth decreases when the frequency increases.

To achieve the aforesaid object, in one embodiment, the aforesaid E-glass fabric is used as the glass fiber cloth (preferably a glass fiber cloth with Dk less than 4.9, such as L-glass fabric or NE-glass fabric) and impregnated in a resin composition (low dielectric constant resin composition), followed by heating/baking to obtain a prepreg. Two sides of the prepreg are covered with copper foils respectively and subject to lamination to prepare a core. Internal trace layers are then formed using conventional processes including exposure, development, etching, etc., and a build-up method is used on the outer side to make a multi-layer board, which is then subject to laser or mechanical drilling, hole metallization, external trace layer formation, surface treatment, etc. to obtain the multi-layer printed circuit board.

In one embodiment, the resin composition (low dielectric constant resin composition) comprises any one of polyphenylene oxide, polyaniline, polyester, polybutadiene, styrene-butadiene copolymer, styrene maleic anhydride, maleimide, cyanate ester, isocyanurate, epoxy resin, polytetrafluoroethylene, benzoxazine, vinyl compound, a modification thereof, and a combination thereof. For a multi-layer printed circuit board made using glass fiber cloth with Dk less than 4.9 as described above, the dielectric constant of the insulation layers is less than or equal to 3.2, as measured in accordance with methods specified in JIS C2565.

The table below lists resin compositions (low dielectric constant resin compositions) suitable for making insulation layers with Dk less than or equal to 3.2, wherein the insulation layers are made by impregnating two pieces of 1037 glass fiber cloth (L-glass fabric or NE-glass fabric) with the low dielectric constant resin compositions and using conventional techniques to make copper-free laminates, and the dielectric constant of the insulation layers (with a resin content of 75%) is measured in accordance with JIS C2565 at 2 GHz. It should be noted that the low dielectric constant resin compositions of this invention are not particularly limited, and any resin composition will be applicable if an insulation layer made therefrom has a dielectric constant of 3.4 or less or preferably 3.2 or less. The components, contents and ratios of the resin compositions listed below are merely exemplary and not limiting.

TABLE 1

| Ingredient/Item | Example | A1 | A2 | A3 | A4 | A5 |
|---|---|---|---|---|---|---|
| Epoxy resin | DCPD epoxy resin | 100 | 100 | | 50 | 100 |
| | Naphthalene epoxy resin | | | 100 | 50 | |
| Benzoxazine | Benzoxazine | 50 | | | | 30 |
| | DCPD benzoxazine | | 50 | 50 | 50 | 20 |
| Vinyl compound | Vinyl DCPD | | 15 | | | |
| Phenol | DCPD phenol | 30 | | 20 | | |
| | Naphthalene-containing phenol | | 15 | | 20 | |
| Polyester | Polyester | | | | 30 | 30 |
| Maleimide | Maleimide | | | | | 10 |
| Triallyl isocyanurate | Triallyl isocyanurate | | | | 10 | 10 |
| Polyphenylene oxide | Polyphenylene oxide | | | 10 | | |
| Polyvinyl butyral | Polyvinyl butyral | | | | 10 | 10 |
| Curing accelerator | Imidazole | V | V | V | V | V |
| | Peroxide | | V | | V | V |
| Filler | Fused silica | 5 | 5 | 5 | 20 | 5 |
| | Hollow filler | 15 | 15 | 15 | | 15 |
| Glass fiber cloth | L-glass fabric | V | V | V | | |
| | NE-glass fabric | | | | V | V |
| Dielectric constant of insulation layers at 2 GHz, resin content of 75% | | 3.20 | 3.15 | 3.13 | 3.11 | 3.10 |

NOTE:
The amounts specified above are parts by weight; "V" represents presence; the content of curing accelerator bears no relation to the dielectric constant of insulation layers, so a use amount in the resin composition general to a skilled person may be used. In Table 1, A1 through A5 represent different examples of resin compositions.

In addition, the low dielectric constant resin composition described herein may be purchased from Elite Material Co., Ltd. under the trade name of EM-355(D), which is a low dielectric constant resin composition useful with an E-glass fabric, such that a dielectric constant of 3.33 can be measured from the insulation layers at 2 GHz from a copper-free laminate with 75% resin content. Preferably, the low dielectric constant resin composition described herein may be purchased from Elite Material Co., Ltd. under the trade name of EM-355(D)K, which is a low dielectric constant resin composition useful with an L-glass fabric, such that a dielectric constant of 3.13 can be measured from the insulation layers at 2 GHz from a copper-free laminate with 75% resin content.

Using the above-recited glass fiber clothes, resin compositions and process conditions, the multi-layer printed circuit board provided by this invention may be subject to layer reduction design to reduce the thickness, such as from 14 layers to 12 layers, from 12 layers to 10 layers, from 10 layers to 8 layers, from 8 layers to 6 layers, and so on, while a desirable characteristic impedance can still be maintained, such as a characteristic impedance between 45 and 55Ω in single-ended signaling and between 90 and 110Ω in differential signaling, or a characteristic impedance of about 50Ω in single-ended signaling and about 100Ω in differential signaling.

Generally, reference can be made from the following publications, with or without modifications, to find technical solutions for layer reduction design, all of which are incorporated by reference herein in their entirety: U.S. Pat. No. 6,614,325, U.S. Pat. No. 6,437,991, U.S. Pat. No. 6,384,340 and U.S. Pat. No. 6,103,977.

Embodiments

For clarity and completeness, E1 through E7 below represent different examples of circuit boards according to the present disclosure, and C1 through C5 below represent different comparative examples of circuit boards according to the present disclosure. In Example 1 (E1), EM-355(D) prepregs (E-glass fabric, type 1037, resin content 75%) sold by Elite Material Co., Ltd. are used to make an eight-layer circuit board following the processes of conventional layer reduction techniques. In Example 2 (E2), EM-355(D)K prepregs (L-glass fabric, type 1037, resin content 75%) sold by Elite Material Co., Ltd. are used to make an eight-layer circuit board following the processes of conventional layer reduction techniques. In Examples 3 to 7 (E3 to E7), various ingredients of resin composition A3 shown in Table 1 are well mixed to prepare resin varnish, and L-glass fabric (1037) or NE-glass fabric is impregnated with the varnish to prepare a prepreg (resin content 75%); then a plurality of prepregs thus prepared are used to make an eight-layer circuit board following the processes of conventional layer reduction techniques. In Comparative Example 1 (C1), EM-285 prepregs (FR-4.1 material, E-glass fabric, type 1037, resin content 75%) sold by Elite Material Co., Ltd. are used to make a ten-layer circuit board without implementing layer reduction. In Comparative Examples 2 to 4 (C2 to C4), EM-285 prepregs (FR-4.1 material, E-glass fabric, type 1037, resin content 75%) sold by Elite Material Co., Ltd. are used, and in Comparative Example 5 (C5), L-glass fabric is used to make EM-285 prepregs (type 1037, resin content 75%). Prepregs of Comparative Examples 2 to 5 are used to make an eight-layer circuit board with layer reduction. During the manufacturing process, ⅓ oz high temperature elongation (HTE) copper foils are used to prepare copper-clad laminates, and the copper foils are thickened by known plating process to 20 μm. The characteristic impedance (Ω) in single-ended signaling of inner trace for each of the circuit boards of E1 to E7 and C1 to C5 is measured by a time-domain reflectometer (TDR) following the methods specified in IPC-TM-650-2.5.5.7, which is incorporated by reference herein in entirety. An automatic optical copper pattern inspector and a verify repair station (VSR) are used to examine trace width and calculate the yield rate. An optical microscope is employed to measure the insulation layer height, the conductive layer thickness, and the trace width of the multi-layer boards. In addition, for each Example and Comparative Example, two prepregs are superimposed and covered on two sides with ⅓ oz HTE copper foils to make a copper-clad laminate. A copper-free laminate obtained by etching off the surface copper foils of the copper-clad laminate is then subject to measurement of insulation layer dielectric constant at 2 GHz according to JIS C2565 (resin content 75%).

Figure 2:
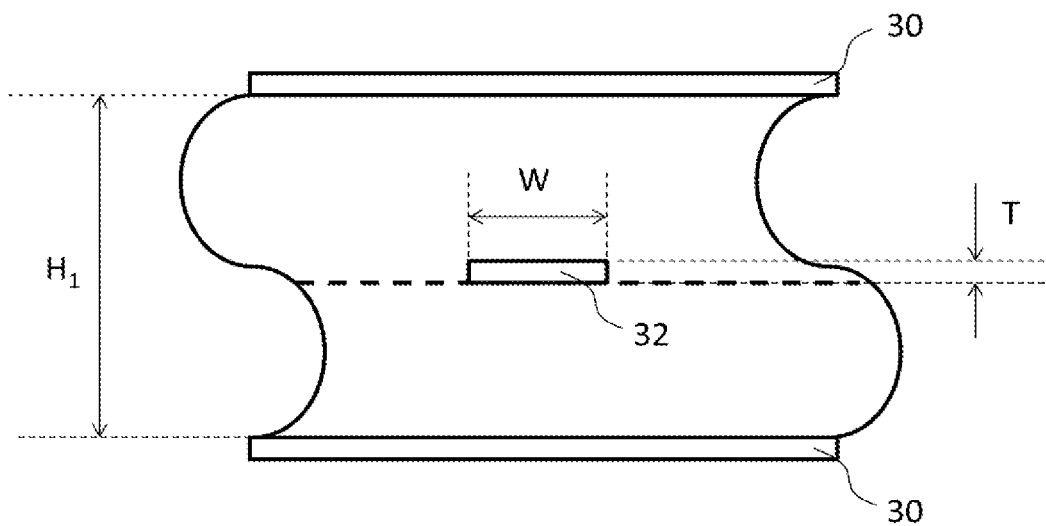
FIG. 2 illustrates trace width W, insulation layer height $H_1$ and conductive layer thickness T of inner trace.
Figure 3:
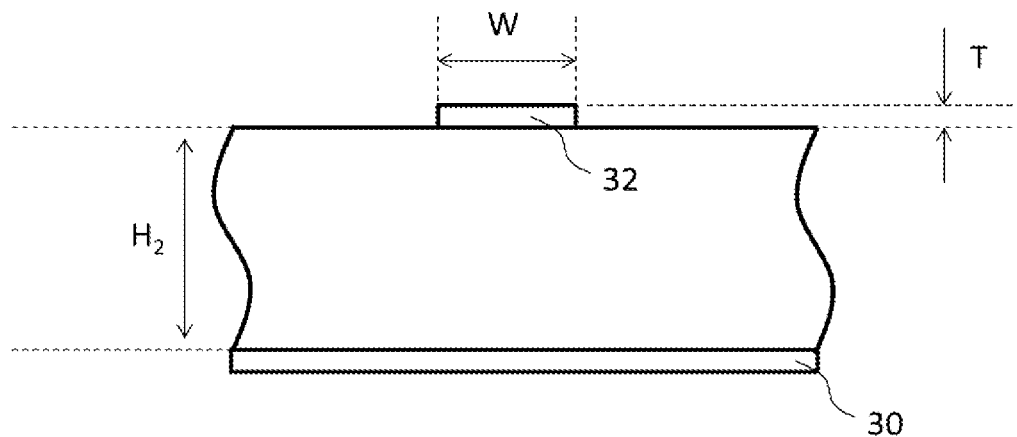
FIG. 3 illustrates trace width W, insulation layer height $H_2$ and conductive layer thickness T of outer trace.
Figure 4:
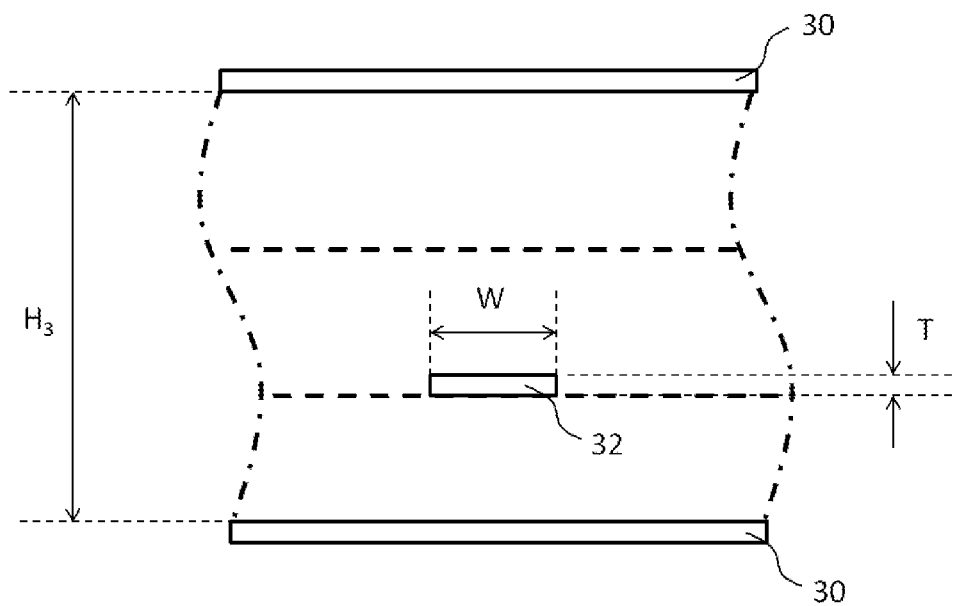
FIG. 4 illustrates trace width W, insulation layer height $H_3$ and conductive layer thickness T of inner trace of Comparative Example C1.

FIG. 2 illustrates trace width W, insulation layer height $H_1$ and conductive layer thickness T of inner trace for E1 to E7 and C2 to C5, wherein the numeral 30 refers to the return layers (as ground layers), the numeral 32 refers to the trace layers (as signal layers), the insulation layer height $H_1$ is the thickness of insulation layer material between two return layers 30, and the thicker broken line illustrates that the insulation layer material between two return layers 30 is made of two prepregs subject to lamination and curing. In addition, FIG. 3 illustrates trace width W, insulation layer height $H_2$ and conductive layer thickness T of outer trace, wherein the numerals 30 and 32 are as defined above. FIG. 4 illustrates trace width W, insulation layer height $H_3$ and conductive layer thickness T of inner trace of Comparative Example 1 (C1), wherein the numerals 30 and 32 are as defined above. The insulation layer height $H_3$ is the thickness of insulation layer material between two return layers 30, and the thicker broken lines illustrate that the insulation layer material between two return layers 30 is made of three prepregs subject to lamination and curing.

Table 2 lists the physical parameters, yield rate, number of circuit processes, and total costs of the Examples E1 to E7 and Comparative Examples C1 to C5 according to the present invention:

TABLE 2

|  | E1 | E2 | E3 | E4 | E5 | E6 | E7 | C1 | C2 | C3 | C4 | C5 |
|---|---|---|---|---|---|---|---|---|---|---|---|---|
| Number of PCB layers | 8 | 8 | 8 | 8 | 8 | 8 | 8 | 10 | 8 | 8 | 8 | 8 |
| Layer reduction | Yes | Yes | Yes | Yes | Yes | Yes | Yes | No | Yes | Yes | Yes | Yes |
| Insulation layer height (μm) | 125 | 125 | 125 | 125 | 125 | 125 | 125 | 180 | 125 | 125 | 125 | 125 |
| Conductive layer thickness (μm) | 20 | 20 | 20 | 20 | 20 | 20 | 20 | 20 | 20 | 20 | 20 | 20 |
| Trace width (μm) | 50 | 50 | 40 | 45 | 50 | 55 | 60 | 55 | 55 | 50 | 35 | 55 |
| Glass fiber cloth | E-glass fabric | L-glass fabric | L-glass fabric | L-glass fabric | NE-glass fabric | L-glass fabric | L-glass fabric | E-glass fabric | E-glass fabric | E-glass fabric | E-glass fabric | L-glass fabric |
| Resin composition | EM-355(D) | EM-355(D) | Low Dk | Low Dk | Low Dk | Low Dk | Low Dk | FR-4.1 | FR-4.1 | FR-4.1 | FR-4.1 | FR-4.1 |
| Dk of insulation layers | 3.33 | 3.13 | 3.15 | 3.15 | 3.15 | 3.15 | 3.15 | 3.80 | 3.80 | 3.80 | 3.80 | 3.60 |

TABLE 2-continued

|  | E1 | E2 | E3 | E4 | E5 | E6 | E7 | C1 | C2 | C3 | C4 | C5 |
|---|---|---|---|---|---|---|---|---|---|---|---|---|
| Characteristic impedance in single-ended signaling (Ω) | 47.91 | 49.42 | 54.18 | 51.59 | 49.26 | 47.14 | 45.20 | 53.62 | 42.92 | 44.85 | 51.96 | 44.10 |
| Yield rate of trace formation process | >90% | >90% | >85% | >90% | >90% | >90% | >90% | >90% | >90% | >90% | 40~55% | >90% |
| Number of circuit process cycles | 4 | 4 | 4 | 4 | 4 | 4 | 4 | 5 | 4 | 4 | 4 | 4 |
| Overall costs | Low | Low | Low | Low | Low | Low | Low | High | Production requirements not met | Production requirements not met | Extremely high | Production requirements not met |

NOTE:
Insulation layer height and conductive layer thickness recited above are means of multiple layers, and trace width represents lower trace width.

As illustrated in Table 2, E1 involves a multi-layer printed circuit board implementing layer reduction (from 10 layers to 8 layers) and uses a low dielectric constant resin composition with low dielectric constant (Dk<3.4) to make insulation layers; E2 to E7 all involve a multi-layer printed circuit board implementing layer reduction (from 10 layers to 8 layers) and use glass fiber cloth with specified dielectric constant (Dk<4.9) and low dielectric constant resin composition to make insulation layers (Dk<3.2); therefore, even though the thickness is decreased as compared with that before layer reduction, these circuit boards can still be manufactured with processes for 40-60 μm trace width, and the characteristic impedance $Z_o$ in single-ended signaling is 50Ω±10% (i.e. ranging from 45 and 55 ohm). High yield rates (all above 85%) can be achieved for each Example, and eight layers require only four circuit process cycles that individually has to consider the yield rate of machines, power consumption, and material loss, thereby substantially lowering the overall costs.

Comparative Example C1 does not implement layer reduction and therefore requires five circuit process cycles, resulting in high overall costs and greater thickness of PCB thus made, not meeting the demands for compactness and light weight. Comparative Examples C2 and C3 both implement layer reduction and have the same insulation layer height, conductive layer thickness and trace width as Examples E5 and E6 respectively; however, Comparative Examples C2 and C3 use glass fiber cloth with higher Dk and FR-4.1 resin composition with higher Dk, so the dielectric constant of the insulation layers is higher, not meeting the production requirement of 50Ω±10% characteristic impedance, such that the PCBs thus made have high signal loss, poor properties and high defective rate. Comparative Example C4 also implements layer reduction and has only eight layers; however, in order to meet the demand of characteristic impedance, more severe process conditions are required to achieve smaller trace width (35 μm), which causes substantial decrease of yield rate and increase of defective rate and overall costs. In addition, Comparative Example C5 uses low Dk glass fiber cloth and FR-4.1 resin composition with higher Dk, but still fails to meet the production requirement of desirable characteristic impedance, such that the PCB thus made has high signal loss, poor properties and high defective rate.

As illustrated by the results in Table 2, this invention uses low Dk glass fiber cloth in conjunction with prespecified resin composition to make low Dk insulation layers suitable for 40 to 75 μm trace width processes; therefore, without deteriorating the product yield rate, a characteristic impedance between 45 and 55Ω in single-ended signaling can be achieved to ensure high signal transmission properties of the products made thereby.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary embodiment has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A multi-layer printed circuit board comprising:
   at least two insulation layers, respectively having glass fiber cloth and cured resin covering thereon, the at least two insulation layers being stacked on top of each other;
   an internal trace layer formed between two neighboring ones of the at least two insulation layers; and
   an external trace layer formed on the outer surface of an outermost one of the at least two insulation layers;
   wherein the at least two insulation layers have a dielectric constant of 3.4 or less, and the internal, and external trace layers have a trace width between 40 and 75 micrometers, such that the multi-layer printed circuit board has a characteristic impedance between 45 and 55Ω in single-ended signaling and between 90 and 110Ω in differential signaling; and wherein the dielectric constant of the at least two insulation layers is measured at a resin content of 75% and a frequency of 2 GHz.

2. The multi-layer printed circuit board of claim 1, wherein the characteristic impedance is measured in accordance with methods specified in IPC-TM-650 2.5.5.7.

3. The multi-layer printed circuit board of claim 1, wherein the glass fiber cloth as a dielectric constant of less than 6.6 at a frequency of 1 GHz to 10 GHz.

4. The multi-layer printed circuit board of claim 1, wherein the dielectric constant of the at least two insulation layers is 3.2 or less at the resin content of 75% and the frequency of 2 GHz.

5. The multi-layer printed circuit board of claim 1, wherein the dielectric constant of the insulation layers is measured in accordance with methods specified in JIS C2565.

6. The multi-layer printed circuit board of claim 1, wherein the trace width of the internal and external trace layers is between 40 and 60 micrometers.

7. The multi-layer printed circuit board of claim 1, wherein the trace width of the internal and external trace layers is between 45 and 55 micrometers.

8. The multi-layer printed circuit. board of claim 1, wherein the characteristic impedance is about 50Ω in single-ended signaling and about 100Ω in differential signaling.

9. The multi-layer printed circuit board of claim 1, wherein the insulation layers are prepared by impregnating the glass fiber cloth in a resin composition followed by heating and lamination, and wherein the resin composition comprises any one of polyphenylene oxide, polyaniline, polyester, polybutadiene, styrene-butadiene copolymer, styrene maleic anhydride, maleimide, cyanate ester, isocyanutrate, epoxy resin, polytetrafluoroethylene, benzoxazine, vinyl compound, and a combination thereof.

* * * * *